(12) United States Patent
Ariga et al.

(10) Patent No.: US 7,891,885 B2
(45) Date of Patent: Feb. 22, 2011

(54) OPTICAL MODULE

(75) Inventors: Maiko Ariga, Tokyo (JP); Kengo Muranushi, Tokyo (JP); Mizuki Oike, Tokyo (JP); Hiroshi Takano, Tokyo (JP); Sayoko Ibe, Tokyo (JP); Toshikazu Mukaihara, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 281 days.

(21) Appl. No.: 12/127,529

(22) Filed: May 27, 2008

(65) Prior Publication Data

US 2009/0129427 A1 May 21, 2009

(30) Foreign Application Priority Data

Nov. 20, 2007 (JP) ............................. 2007-300410

(51) Int. Cl.
*G02B 6/36* (2006.01)
*H01S 3/08* (2006.01)
*H04J 14/02* (2006.01)

(52) U.S. Cl. .......................... 385/92; 385/94; 385/14; 385/88; 372/108; 398/79

(58) Field of Classification Search .............. 385/1, 385/2, 3, 14, 88, 89, 92, 93, 94; 398/79, 398/82, 85; 372/108
See application file for complete search history.

(56) References Cited

U.S. PATENT DOCUMENTS

| | | | | |
|---|---|---|---|---|
| 5,155,777 A * | 10/1992 | Angelopoulos et al. | ....... | 385/14 |
| 6,085,005 A * | 7/2000 | Gates et al. | ................... | 385/88 |
| 6,385,375 B1 * | 5/2002 | Goto | ........................... | 385/49 |
| 6,527,454 B1 * | 3/2003 | Saito et al. | ..................... | 385/88 |
| 6,546,171 B2 * | 4/2003 | Fukutomi | ..................... | 385/49 |
| 6,718,098 B2 * | 4/2004 | Kimura | ......................... | 385/49 |
| 7,125,174 B2 * | 10/2006 | Lo et al. | ....................... | 385/92 |
| 2001/0002942 A1 * | 6/2001 | Fukutomi | ..................... | 385/92 |
| 2001/0033716 A1 | 10/2001 | Fukutomi | ..................... | 385/49 |
| 2003/0202750 A1 | 10/2003 | Okada et al. | .................. | 385/49 |
| 2006/0261258 A1 | 11/2006 | Tawa | .......................... | 250/216 |
| 2008/0055589 A1 * | 3/2008 | Asami et al. | ................ | 356/73.1 |
| 2009/0129427 A1 * | 5/2009 | Ariga et al. | ................. | 372/108 |

FOREIGN PATENT DOCUMENTS

| | | |
|---|---|---|
| JP | 11-74612 | 3/1999 |
| JP | 2001-305365 | 10/2001 |
| JP | 2003-69125 | 3/2003 |
| JP | 2003-318478 | 11/2003 |
| JP | 2003-322770 | 11/2003 |
| JP | 2005-19746 | 1/2005 |
| JP | 2006-216695 | 8/2006 |
| JP | 2006-310704 | 11/2006 |

\* cited by examiner

*Primary Examiner*—Brian M Healy
(74) *Attorney, Agent, or Firm*—Oblon, Spivak, McClelland, Maier & Neustadt, L.L.P.

(57) ABSTRACT

An optical module 10 has a laser light source 20, optical branching means 24 for receiving laser light from the laser light source 20, making a part of the laser light pass through the optical branching means and branching a remaining part of the laser light; a photodetecting portion 30P receiving the remaining part of the laser light branched from the optical branching means 24 and a package 11 holding therein the laser light source 20, the optical branching means 24 and the photodetecting portion 30P, the package 11 having stray light reducing means 200, 201 and 202 provided therein to reduce stray light generated inside the package.

11 Claims, 7 Drawing Sheets

OPTICAL MODULE

TECHNICAL FIELD

The present invention relates to an optical module, and specifically, to an optical module having a laser light source, a photodetector for receiving light output from the laser light source and a package receiving the laser light source and the photodetector, the optical module being capable of reducing stray light in the package.

RELATED ART

For example, an optical module used for optical communications has a laser diode for transmission, a photodiode and a package for holding them. The laser diode generates so-called stray light other than transmission light. This stray light becomes a noise against signal light. This causes inevitable deterioration of the photosensitivity of the photodiode of the optical module, and an attempt has been made to prevent this stray light. As a system for blocking off this stray light, a filter is arranged between the photodiode and a substrate on which the laser diode is mounted and a metal film is deposited on the filter so as to prevent the stray light from the laser diode from diffracting into the photodiode (see for example, Japanese Patent Laid-open Publication No. 2001-305365).

However, the method of blocking off the stray light disclosed in Japanese Patent Laid-open Publication No. 2001-305365 cannot be used to prevent back stray light generated bat the rear of the laser light source, and this back stray light may be diffracted and inserted into the photodiode in the package. In addition, an optical element for guiding light from the laser light source also generates stray light, which may be also diffracted and inserted into the photodiode in the package.

SUMMARY OF THE INVENTION

In order to solve the above-mentioned problems, the present invention has an object to provide an optical module for preventing stray light from the laser light source from entering the photodetector, for example, in the package thereby to prevent deterioration of the photosensitivity of the optical module.

A first aspect of an optical module of the present invention is an optical module having at least a laser light source and a package holding the laser light source therein, the package having a stray light reducing unit for reducing stray light generated in the package.

A second aspect of the optical module of the present invention is an optical module in which the package further has an optical branching unit for receiving laser light from the laser light source, making a part of the laser light pass through the optical branching unit and branching off a remaining part of the laser light; a photodetecting portion receiving the remaining part of the laser light branched off from the optical branching unit.

A third aspect of the optical module of the present invention is an optical module in which the stray light reducing unit is a stray light shield for blocking the stray light.

A fourth aspect of the optical module of the present invention is an optical module in which the stray light reducing unit is a light absorber or light scatterer formed in at least a part of an inner surface of the package.

A fifth aspect of the optical module of the present invention is an optical module in which the inner surface of the package where the light absorber or light scatterer is formed is a surface irradiated with back light of the laser light source.

A sixth aspect of the optical module of the present invention is an optical module in which the laser light source includes a plurality of laser light sources emitting laser light beams of different wavelengths, and the package further has an optical element for gathering the laser light beams emitted from the laser light sources.

A seventh aspect of the optical module of the present invention is an optical module in which the optical element is an MMI (Multi-mode interference) coupler.

An eight aspect of the optical module of the present invention is an optical module in which the package is a holding body and a cover member for closing an opening of the holding body, and the stray light reducing unit is a light absorber or light scatterer formed in an inner surface of the cover member.

A ninth aspect of the optical module of the present invention is an optical module in which the stray light reducing unit is a first stray light shield, provided in a rear of the laser light source inside the package, for blocking back light emitted in the rear of the laser light source.

A tenth aspect of the optical module of the present invention is an optical module in which the first stray light shield has a light absorber or light scatterer formed in a surface thereof.

An eleventh aspect of the optical module of the present invention is an optical module in which the first stray light shield is fixed to the inner surface of the cover member.

A twelfth aspect of the optical module of the present invention is an optical module in which the stray light reducing unit is a second stray light shield covering the photodetecting portion.

A thirteenth aspect of the optical module of the present invention is an optical module in which the second stray light shield has a light absorber or light scatterer in a surface thereof.

A fourteenth aspect of the optical module of the present invention is an optical module in which the photodetecting portion has a first photodetector for detecting an output of the remaining part of the laser light and a second photodetector for detecting a wavelength of the remaining part of the laser light.

DETAILED DESCRIPTION OF THE INVENTION

With reference to the drawings, preferred embodiments of the present invention will be described below.

Figure 1:
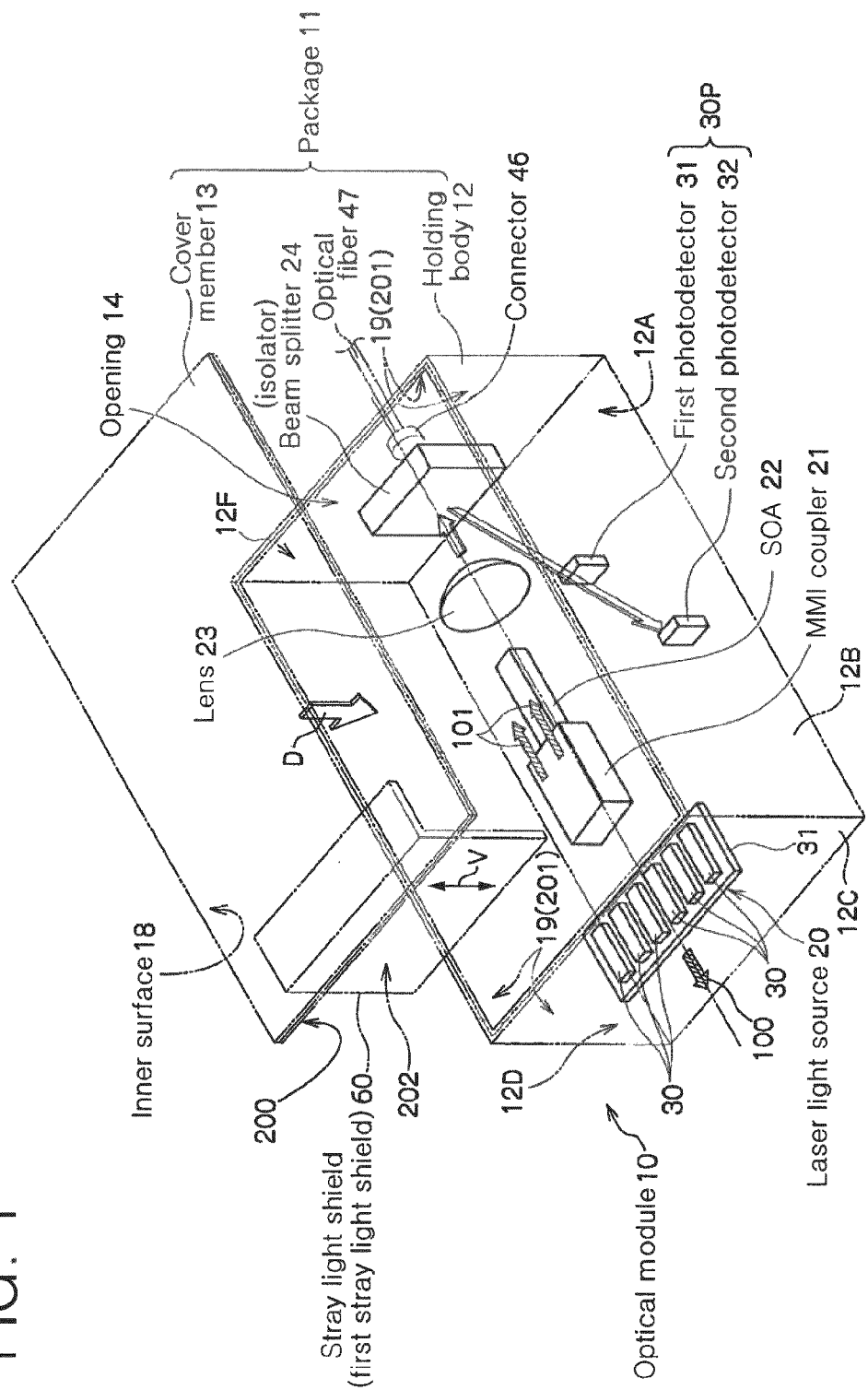
FIG. 1 is a perspective view illustrating an optical module according to a preferred embodiment of the present invention.
Figure 2:
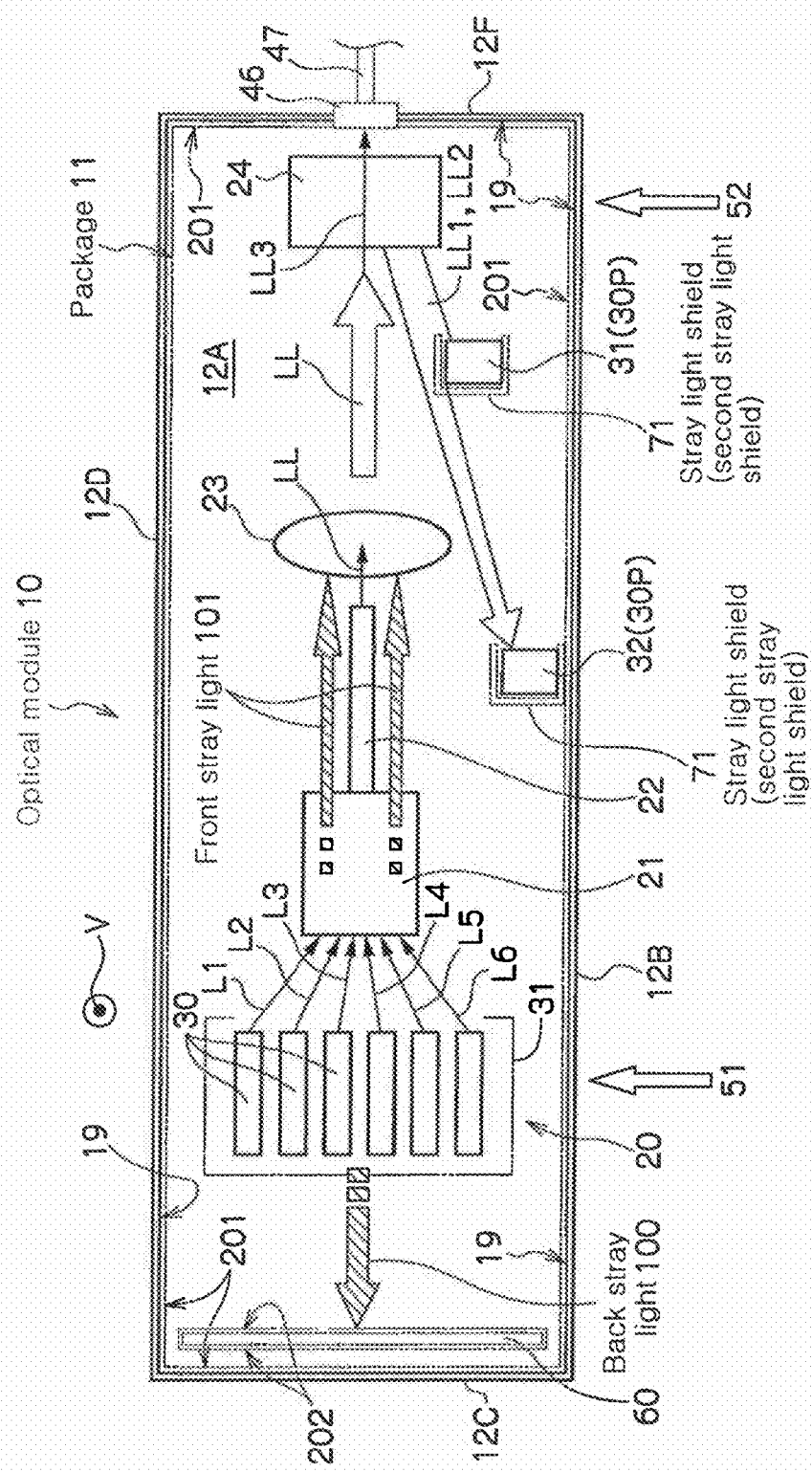
FIG. 2 is a plane view illustrating an arrangement example of optical elements in the package of the optical module shown in FIG. 1.

FIG. 1 is a perspective view of a preferred embodiment of the optical module of the present invention. FIG. 2 is a plane view illustrating an arrangement example of optical elements in the package of the optical module shown in FIG. 1.

The optical module 10 shown in FIGS. 1 and 2 has a box-shaped package 11, a laser light source 20 and plural optical elements held in the package 11.

The optical elements are an MMI (Multi-mode (registered trademark) interference) coupler (also called multi-mode interference waveguide) 21, an SOA (Semiconductor Amplifier) 22, a lens 23, a beam splitter 24 as an optical isolator (optical branching means), a first photodetector 31 and a second photodetector 32 as a photodetecting portion 30P. The first photodetector 31 and the second photodetector 32 used here may be, for example, photodiodes.

The laser light source 20 is, for example, a DFB (distributed feedback laser). The laser light source 20 has a plurality of laser light generating portions 30 and a substrate 31 on which these laser light generating portions 30 are arranged.

The optical module 1 shown in FIG. 1 is used, for example, in optical communications, as an optical transmitter/receiver having both a transmitting function and a receiving function.

The package 11 shown in FIG. 1 has a holding body 12 and a cover member 13, and the cover member 13 is a member for closing a rectangular opening 14 of the holding body 12 to seal the optical elements from the outside.

The package 11 is made of a material having, for example, an electric insulating property, which is, for example, plastic. The holding body 12 has a bottom surface portion 12A and side surface portions 12B to 12F. On the inner surface 19 of the holding body 12, for example, a stray light reducing film (also called "stray light suppressing film") 201 is formed by blackening by raydent processing. Likewise, on the inner surface 18 of the cover member 13, for example, a stray light reducing film (also called "stray light suppressing film") 200 is formed by blackening by raydent processing.

In this structure, the stray light reducing film 201 on the inner surface 19 of the holding body 12 and the stray light reducing film 200 on the inner surface 18 of the cover member 13 are stray light reducing means capable of suppressing or reducing stray light generated in the package 11 by absorbing wavelengths of the stray light to reduce the reflectance of the stray light.

This blackening processing is also called stray light reducing processing (or, stray light suppressing processing), in which, more specifically, a blackening material, such as Iron oxide black and carbon black, that are effective in absorbing light of use wavelengths is used to chemically form the stray light reducing films 200 and 201 on the inner surface 18 of the cover member 13 and the inner surface 19 of the holding body 12, respectively.

The degree of blackening by the stray light reducing processing is not limited to this and may include blue color and brown color and charcoal color close to black. In other words, the color may be such a color that the stray light can be absorbed by plural times of reflection even when all of the stray light is not absorbed by one-time reflection.

As described above, the stray light reducing films 200 and 201 are one example of stray light reducing means for suppressing or reducing stray light caused on the inner surfaces of the holding body 12 and the cover member 13.

Here, used as the stray light reducing means may be a light absorber or light scatterer. The light absorber is formed by the surface blackening processing as described above. The surface blackening processing is for example, electroless nickel raydent processing or the like. Besides, the light scatterer reduces light coupled to the photodetecting portion by scattering light or changing direction of the reflected light. For example, the light scatterer is obtained by forming a concavo-convex structure on the surface thereof.

Description here is made about the stray light generated in the optical module according to the embodiment of the present invention. Front stray light 101 is laser light that is output from the front end surface of the laser light source 20 and not coupled by the MMI coupler 21. Back stray light 100 is laser light output from the front end surface of the laser light source 100.

Out of them, as the optical module 10 of this embodiment of the present invention has no reflection coating formed at the back end surface of the laser light source (also called "laser element") 20, the optical module 10 is designed to reduce increasing effect of the back stray light. The reason for no such a reflection coating formed is that wavelength of output laser light is shifted when the reflectance is different between the front end surface and the back end surface. For this reason, there is a need to take measures against the back stray light of the laser light source 20.

Next description is made about the arrangement example of the optical elements in the package with reference to FIGS. 1 and 2.

As shown in FIGS. 1 and 2, the opening 14 at the top of the holding body 12 is closed by the cover member 13 so that light from the outside can be prevented from entering the inside of the package 11.

As shown in FIG. 2, the laser light source 20 is arranged to the first end 51 side on the inner surface of the bottom surface portion 12A of the holding body 12. This first end 51 is a position corresponding to the side surface portion 12C of the holding body 12. The beam splitter 24 is arranged to the second end 52 side on the inner surface of the bottom surface portion 12A of the holding body 12. This second end 52 is a position corresponding to the side surface portion 12F of the holding body 12.

As shown in FIG. 2, the MMI coupler 21, the SOA 22 and the lens 23 are arranged between these first end 51 and second end 52 on the inner surface of the bottom surface portion 12A of the holding body 12.

The photodetecting portion 30P has the first photodetector 31 and the second photodetector 32. The first photodetector 31 detects outputs of other laser light beams LL1 and LL2 and the second photodetector 32 detects wavelengths thereof.

As shown in FIG. 2, the first photodetector 31 is arranged in the vicinity of the lens 23 and the beam splitter 24 on the inner surface of the bottom surface portion 12A of the holding body 12, while the second photodetector 32 is arranged in the vicinity of the SOA 22 and the lens 23 on the inner surface of the bottom surface portion 12A of the holding body 12. The second photodetector 32 is arranged nearer the side surface portion 12B than the first photodetector 31.

As described above, the laser light source 20 arranged in the holding body 12 emits any combination of laser light beams L1 to L6 of different wavelengths, such combined at least two laser light beams (L1 to L6) are input to the MMI coupler 21 to be combined.

The combined laser light is optically amplified by the SOA 22, passes through the lens 23 as laser light LL to gather, and is reflected by the beam splitter 24. A part of the laser light LL passes through the beam splitter 24 and is guided to an optical fiber 47 outside a connector 46. This connector 46 is mounted on the side surface portion 12F of the package 11, to which the optical fiber 47 is detachably connectable.

Thus, when the laser light source 20 emits any combination of laser light beams L1 to L6 of different wavelengths, there occurs stray light from the laser light source 20 and the MMI coupler 21 inside the package 11. In other words, the back stray light 100 emits from the laser light source backward (toward the side surface portion 12C). This back stray light 100 has to be prevented from being reflected inside the package 11 to be inserted into the first photodetector 31 and the second photodetector 32.

Beside, the front stray light 101 is generated from the side of the MMI coupler 21 frontward. This front stray light 101 has to be prevented from entering the first photodetector 31 and the second photodetector 32 via the lens 23. Without this prevention, there may occur errors between received light signals of the first photodetector 31 and the second photodetector 32.

Then, the embodiment of the present invention adopts the above stray light reducing means in order to prevent or suppress the above-mentioned back stray light 100 and the front stray light 101 from reaching the first photodetector 31 and the second photodetector 32. As described above, the stray light reducing film 201 is formed on the inner surface of the holding body 12 and the stray light reducing film 200 is formed on the inner surface 18 of the cover member 13 as the stray light reducing means In addition to these stray light reducing films 200 and 201, as shown in FIGS. 1 and 2 and FIGS. 3 and 4, there is provided a stray light shield 60 (on example of first stray light shield) on the inner surface 18 of the cover member 13. This stray light shield 60 is a plate member formed having an L-shaped cross section. This stray light shield 60 has a stray light reducing film 202 around the same like the stray light reducing films 200 and 201 of the inner surface of the cover member 13 and the inner surface 19 of the holding body 12.

Figure 4:
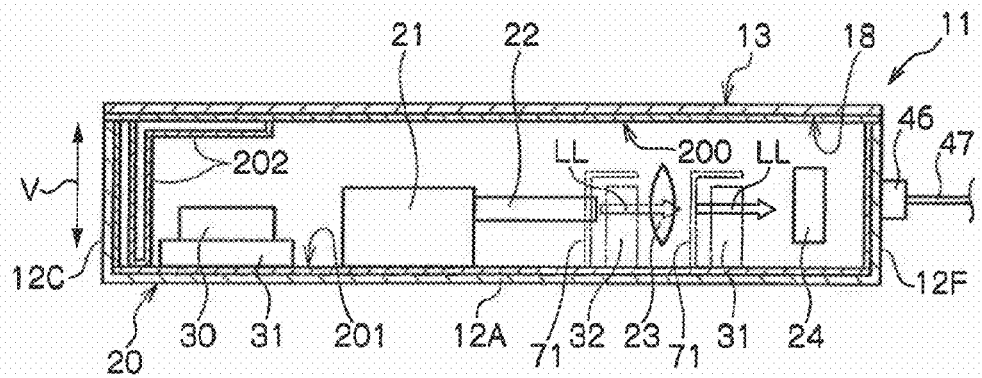
FIG. 4 is a view illustrating the inside of the package of the optical module.

As shown in FIG. 4, when the cover member 13 closes the opening 14 of the holding body 12, this stray light shield 60 is arranged along the V direction between the laser light source 20 and the side surface portion 12C.

Figure 5:
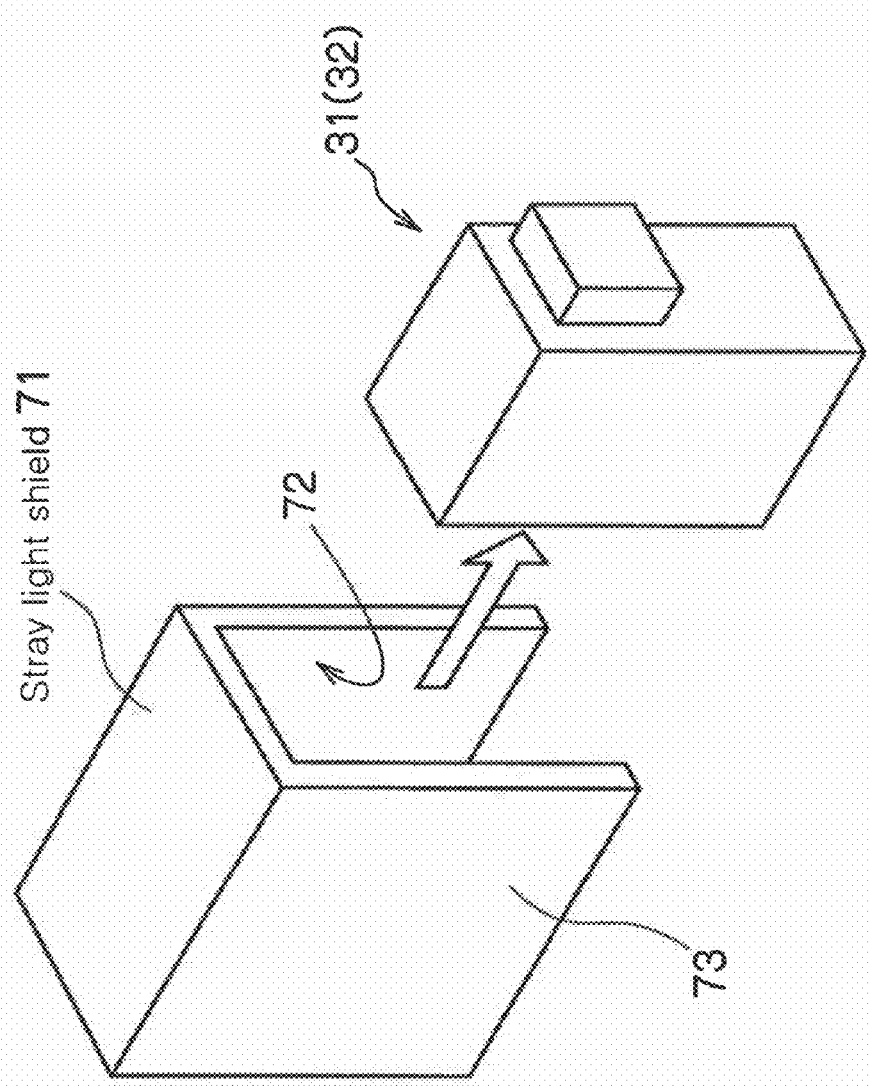
FIG. 5 is a view showing stray light shield arranged over the photodetecting portion.

Further as shown in FIGS. 4 and 5, there are box-shaped stray light shields 71 provided over the first photodetector 31 and the second photodetector 32, respectively. Each stray light shield 71 is also called "photodetecting cover" and has formed, for example, on the inner surface 72 and the outer surface 73 shown in FIG. 5 stray light reducing film like the stray light reducing films 200 and 201 formed on the inner surface of the cover member 13 and the inner surface 19 of the holding body 12 so as to prevent or suppress the back stray light 100 and the front stray light 101 from entering the first photodetector 31 and the second photodetector 32. Here, the stray light shield 71 may be arranged over the second photodetector only which is closer to the MMI coupler 21 and the laser light source than the first photodetector 31.

Further, more preferably, the reflectance of the beam splitter 24 is increased to increase signal light to be input to the first photodetector 31 and the second photodetector 32. This allows keeping of S/N (signal light/stray light) required to the first photodetector 31 and the second photodetector 32.

Further, it is possible to adopt combination of the stray light reducing films 200 and 201 formed on the inner surface 18 of the cover member 13 and the inner surface 19 of the holding body 12 of the package 11 and the stray light shield 60.

Furthermore, it is preferable to adopt combination of the stray light reducing films 200 and 201 formed on the inner surface 18 of the cover member 13 and the inner surface 19 of the holding body 12 of the package 11, the stray light shield 60 and the stray light shields 71 arranged over the first photodetector 31 and the second photodetector 32 respectively.

It is preferable to adopt increase of the reflectance of the beam splitter 24 in any of the above-mentioned combinations.

Here, as to the embodiment of the present invention which takes measures to reduce stray light in the optical module, its specific examples that show reduction of the stray light are compared with conventional examples that takes no measures to reduce the stray light

TABLE 1

| | Ts | | | |
|---|---|---|---|---|
| | 10° C. | | 50° C. | |
| | PD1 [μA] | PD2 [μA] | PD1 [μA] | PD2 [μA] |
| Comparative example 1 | 7.9 | 11.47 | 4.7 | 7.10 |
| Comparative example 2 | 7.5 | 13.70 | 4.2 | 7.74 |
| Comparative example 3 | 7.0 | 10.36 | 4.3 | 6.85 |
| Comparative example 4 | 8.1 | 12.95 | 5.0 | 8.46 |
| Comparative example 5 | 7.0 | 13.00 | 4.1 | 8.10 |
| Comparative example 6 | 7.5 | 13.80 | 4.9 | 9.38 |
| Example of the Present Invention 1 | 3.1 | 7.79 | 1.9 | 5.33 |
| Example of the Present Invention 7 | 1.8 | 0.82 | 0.9 | 0.51 |
| Comparative example 7 | 7.9 | 11.44 | 4.6 | 7.21 |
| Example of the Present Invention 2 | 3.4 | 6.00 | 1.8 | 3.79 |
| Example of the Present Invention 8 | 2.3 | 0.75 | 1.1 | 0.45 |
| Comparative example 8 | 12.8 | 19.57 | 8.0 | 12.68 |
| Comparative example 10 | 11.7 | 8.82 | 7.2 | 5.45 |
| Comparative example 11 | 11.8 | 9.07 | 7.3 | 5.66 |
| Comparative example 12 | 12.3 | 9.95 | 7.6 | 6.32 |
| Comparative example 9 | 7.5 | 11.51 | 5.0 | 7.85 |
| Comparative example 13 | 7.0 | 4.88 | 4.6 | 3.29 |
| Comparative example 14 | 8.0 | 4.76 | 5.1 | 3.21 |
| Comparative example 15 | 8.5 | 5.65 | 5.7 | 3.83 |
| Example of the Present Invention 9 | 4.4 | 1.00 | 1.3 | 0.35 |
| Example of the Present Invention 10 | 4.5 | 1.11 | 1.3 | 0.39 |
| Example of the Present Invention 11 | 4.5 | 0.98 | 1.3 | 0.34 |
| Example of the Present Invention 12 | 4.5 | 1.03 | 1.3 | 0.36 |
| Example of the Present Invention 13 | 4.5 | 1.00 | 1.3 | 0.36 |
| Example of the Present Invention 3 | 4.7 | 5.10 | 1.5 | 2.18 |
| Example of the Present Invention 4 | 4.7 | 5.00 | 1.5 | 2.14 |
| Example of the Present Invention 5 | 4.8 | 5.28 | 1.5 | 2.24 |
| Example of the Present Invention 6 | 4.7 | 5.06 | 1.5 | 2.16 |

In Table 1, the comparative examples 1 to 15 out of the range of the present invention and the examples 1 to 13 of the embodiment of the present invention present intensity of stray light received by each of the first photodetector (PD1) and the second photodetector (PD2). The respective intensities of the stray light received by the first photodetector 31 (PD1) and the second photodetector 32 (PD2) are shown by current amounts (μA) passing through the first photodetector (PD1) and the second photodetector (PD2) when they receive the stray light.

The comparative examples 1 to 9 shows the case of no measures taken to suppress the stray light inside the package and the comparative examples 10 to 15 show the case in which a skirt (shield) arranged backside of the laser light source but no blackening processing is performed on this skirt.

The examples 1 to 6 of this invention show the case in which the stray light reducing films 200 and 201 are formed on the inner surface of the cover member 13 and the inner surface 19 of the holding body 12 of the package 11 of the embodiment of the present invention, and especially, the cover member 13 used has been subjected to blackening processing.

The examples 7 to 13 of this invention show the case in which the stray light reducing films 200 and 201 are formed on the inner surface of the cover member 13 and the inner surface 19 of the holding body 12 of the package 11 of the embodiment of the present invention, and the stray light shield 60 is provided which has been subjected to blackening processing.

As seen from Table 1, the comparative examples 1 to 15 show the stray light received by the first photodetector and the second photodetector is large and the examples 1 to 6 of the present invention show the stray light received by the first photodetector and the second photodetector is suppressed or decreased as compared with that of the comparative examples 1 to 15. Likewise, the 7 to 13 of the present invention show the stray light received by the first photodetector and the second photodetector is suppressed or decreased as compared with that of the comparative examples 1 to 15.

Regarding the way of performing the stray light reducing processing such as blackening on the inner surface of the bottom surface portion 12A and the inner surfaces of the side surfaces portion 12B and performing the stray light reducing processing on the inner surface of the cover member 13; and the way of arranging at the rear of the laser light source the stray light shield 60 that has been subjected the stray light reducing processing such as blackening, at least one of them is adopted in combination of any of further arranging of the stray light shield 71 over each of the first photodetector 31 and the second photodetector 32 and increasing of the reflectance of the beam splitter 24 to keep required S/N.

According to the embodiment of the present invention, the optical module 10 comprises at least a laser light source 20, optical branching means 24 for receiving laser light from the laser light source 20, making a part of the laser light pass through the optical branching means and branching off a remaining part of the laser light; a photodetecting portion 30P receiving the remaining part of the laser light branched off from the optical branching means 24 and a package 11 holding therein the laser light source 20, the optical branching means 24 and the photodetecting portion 30P, the package 11 having stray light reducing means (for example, stray light reducing films 200, 201, 202) provided therein to reduce stray light inside the package. This prevents the stray light from the laser light source from diffracting into the photodetecting portion inside the package thereby preventing deterioration of the photosensitivity of the optical module.

In the embodiment of the present invention, when the stray light reducing means is a stray light shield for blocking off the stray light, this stray light shield is arranged to prevent the stray light from the laser light source from diffracting into the photodetecting portion thereby preventing deterioration of the photosensitivity of the optical module.

In the embodiment of the present invention, the optical module 10 has at least a laser light source 20, and a package 11 holding therein the laser light source 20. Then, the package 11 has provided therein the stray light reducing means for reducing stray light caused inside the package 11. This prevents the stray light from the laser light source 20 from diffracting into the photodetecting portion inside the package thereby preventing deterioration of the photosensitivity of the optical module.

In the embodiment of the present invention, the stray light reducing means is a light absorber or light scatterer formed in at least a part of the inner surface of the package. This prevents the stray light from diffracting into the photodetecting portion thereby preventing deterioration of the photosensitivity of the optical module.

In the embodiment of the present invention, as the inner surface of the package where the light absorber or light scatterer is formed is a surface irradiated with light in the rear of the laser light source, it is possible to reduce the stray light in the rear of the laser light source.

In the optical module 10 according to the embodiment of the present invention, the laser light source 20 includes a plurality of laser light sources emitting laser light beams of different wavelengths and the package 11 further has an MMI coupler 21 as an optical element for gathering the light beams emitted from the plural laser light sources. This enables gathering of the laser light beams emitted from the plural laser light sources.

In the optical module 10 according to the embodiment of the present invention, the optical element is an MMI coupler.

In the optical module of the present invention, the stray light reducing means is a light absorber or light scatterer formed in at least a part of the inner surface of the package. This allows reduction of the stray light generated in the package.

In the optical module 10 according to the embodiment of the present invention, the package 11 has a holding body 12 and a cover member 13 for closing the opening of the holding body 12. The stray light reducing means is a light absorber or light scatterer formed in the inner surface 18 of the cover member 13. This allows reduction of the stray light generated in the package.

In the optical module 10 according to the embodiment of the present invention, the stray light reducing means is a first stray light shield 60 for blocking off back stray light 100 emitted in the rear of the laser light source 20, the stray light shield 60 being provided in the rear of the laser light source 20 inside the package. This allows reduction of the back stray light generated in the package.

In the optical module 10 according to the embodiment of the present invention, the first stray light shield 60 has a light absorber or light scatterer in the surface thereof. This allows reduction of the back stray light generated from the laser light source in the package.

In the optical module according to the embodiment of the present invention, the first stray light shield 60 is fixed to the inner surface 18 of the cover member 13. This allows simple arrangement of the first stray light shield 60 in the rear of the laser light source 20 when closing the opening 14 of the holding body 12 with the cover member 13, thereby facilitating assembling of the optical module even if first stray light shields 60 are increased in number.

In the optical module 10 according to the embodiment of the present invention, the stray light reducing means is a second stray light shields 71 covering the photodetectors 31 and 32. This allows prevention of influence of the stray light on the photodetectors 31 and 32 with use of the second stray light shields 71, thereby preventing the stray light of the laser light source from diffracting into the photodetecting portion thereby preventing deterioration of the photosensitivity of the optical module.

In the embodiment of the present invention, the first stray light shield has a light absorber and light scatterer in the surface thereof, thereby allowing reliable reduction of the stray light generated in the rear of the laser light source.

In the embodiment of the present invention, as the first stray light shield is fixed to the inner surface of the cover member, it is possible to arrange the first stray light shield in the package simply.

In the embodiment of the present invention, the stray light reducing means is a second stray light shield covering the photodetecting portion, thereby allowing reduction of the stray light entering the photodetecting portion in the package.

In the optical module according to the embodiment of the present invention, the photodetecting portion 30P has a photodetector 31 for detecting outputs from partial laser lights LL1, LL2 and a photodetector 32 for detecting wavelengths of the partial laser lights LL1, LL2. This makes it possible to detect the outputs and the wavelengths of the partial laser lights LL1, LL2 while preventing influence of the stray light.

In the optical module according to the embodiment of the present invention, as the light scatterer is provided, total power of the stray light generated in the package is dispersed, which allows reduction of the stray light to enter the photodetecting portion. This enables deterioration of the photosensitivity of the optical module.

Further, in the optical module according to the embodiment of the present invention, the light scatterer is provided, and the stray light is subjected to multiple reflection in the package to elongate the optical path length of the stray light. This deteriorates light amount of the stray light and allows reduction of the stray light to enter the photodetecting portion, thereby preventing deterioration of the photosensitivity of the optical module.

Next description is made about another embodiment of the present invention.

Figure 6:
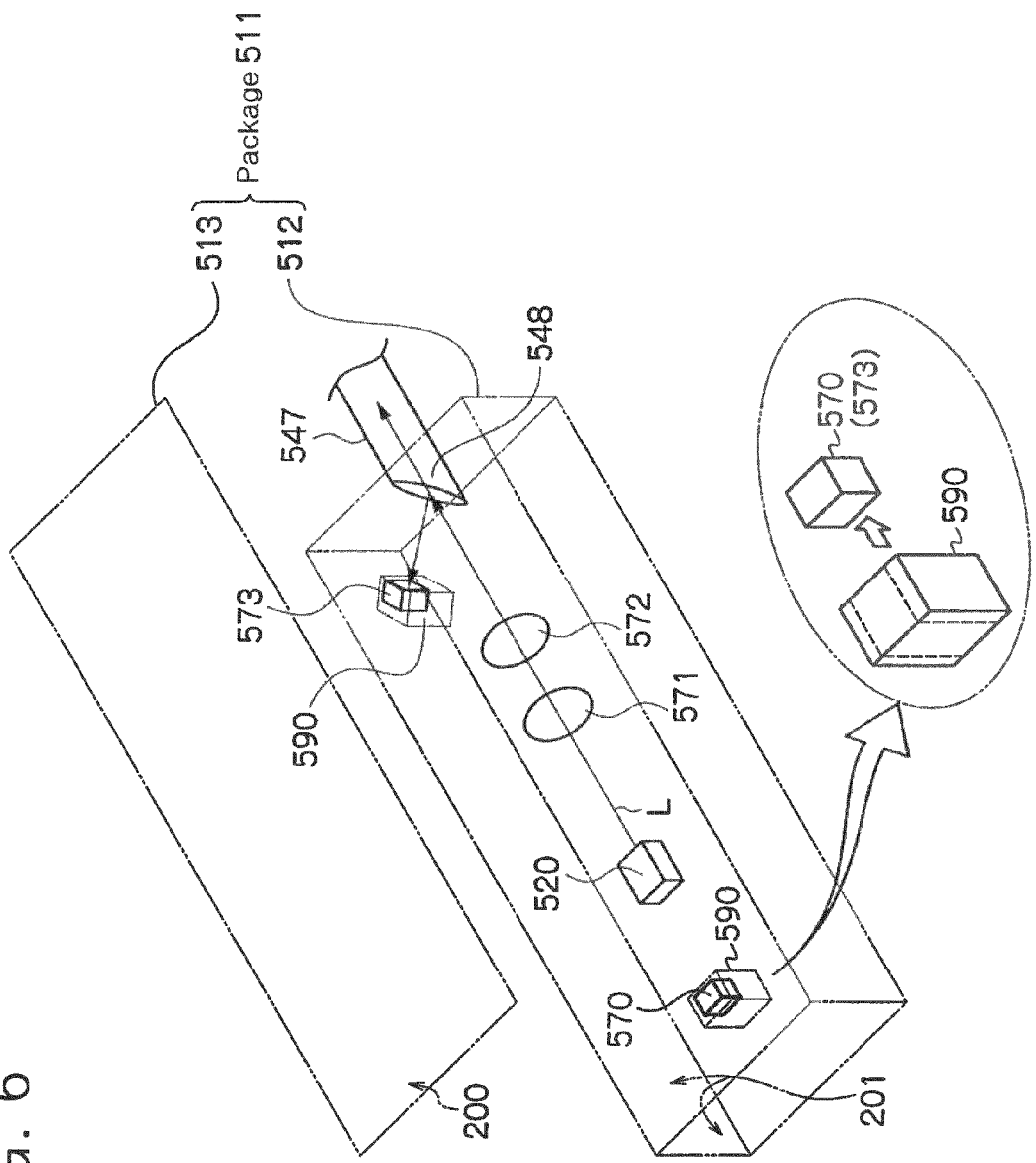
FIG. 6 is a perspective view illustrating another embodiment of the present invention.

FIG. 6 illustrates a laser light source 520 and a package 511. The package 511 has a holding body 512 and a cover member 513, and a laser light source 520, a photodetecting portion 570, lens 571, 572 and a photodetecting portion 573 are held in the package 511. The holding body 512 and the cover member 513 of the package 511 are provided with the stray light reducing means 200 and 201 like the holding body 12 and the cover member 13 described with reference to FIG. 1.

In the holding body 512, a light input end 548 of an optical fiber 547 is arranged having an inclined surface. Laser light L from the laser light source 520 passes through collimating lens 571, 572 to be input to the light input end 548 and into the photodetecting portion 573. Besides, in order to detect an output from the laser light source 520, the photodetecting portion 570 serves to detect back light of the laser light source 520. The photodetecting portions 570, 573 are arranged surrounded with stray light shields 590 so that stray light generated from the laser light L from the laser light source 520 or the back light thereof can be prevented from entering the photodetecting portions 570 and 573.

Here, in FIG. 6, the light input end 548 of the optical fiber 547 may not be formed having an inclined surface, and the laser light L may only be input directly to the optical fiber 547 via the lens 571, 572.

Figure 7:
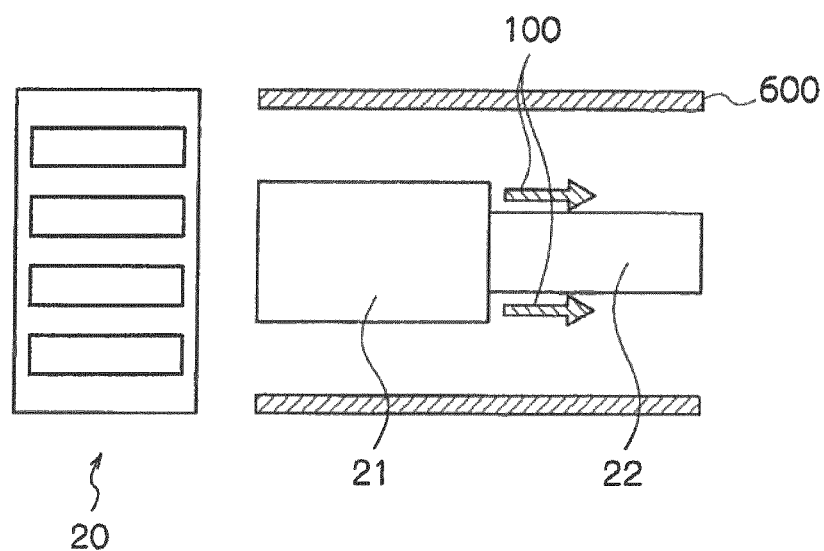
FIG. 7 is a plane view illustrating another embodiment of the present invention.

FIG. 7 illustrates an example in which stray light shields 600 are arranged in the vicinity of the MMI coupler 21. The stray light shields 600 serve to block off the front stray light 101 generated from the sides of the MMI coupler 21, thereby preventing stray light from occurring in the package.

Figure 3:
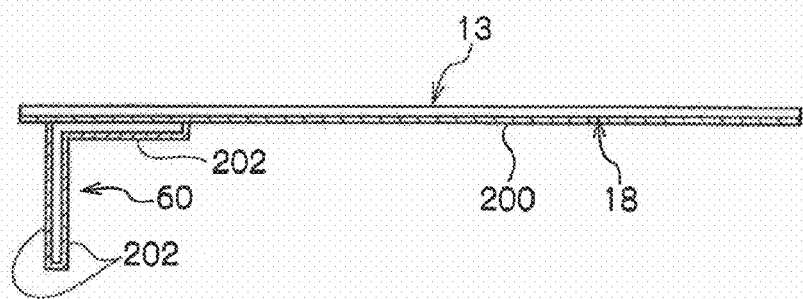
FIG. 3 is a view illustrating a cover member of the package of the optical module and a stray light shield.
Figure 8:
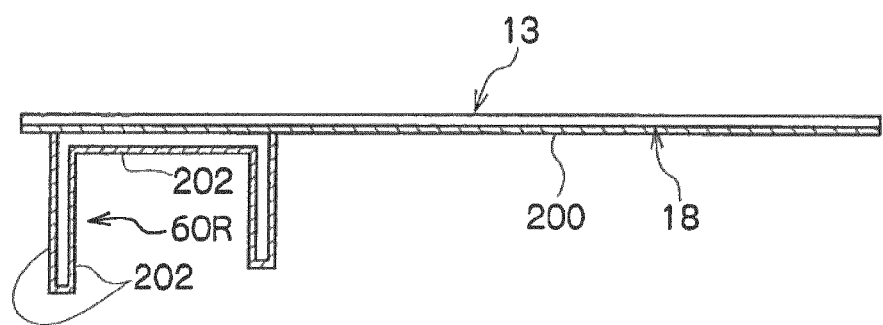
FIG. 8 is a view illustrating a cover member of a package in another embodiment of the present invention.
Figure 9:
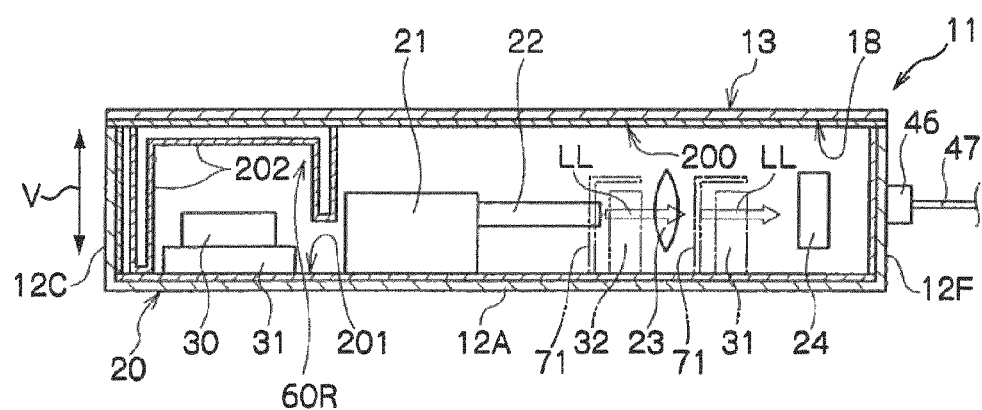
FIG. 9 is a view illustrating the inside of the package of the embodiment shown in FIG. 8.

In the examples shown in FIGS. 8 and 9, a stray light shield 60R is arranged in place of the stray light shield 60 shown in FIGS. 3 and 4. As compared with the stray light shield 60, this stray light shield 60R is formed longer and has a U-shaped cross section not L-shaped cross section. The thus-shaped shield makes it possible to reduce stray light and back stray light generated from the laser light of the laser light source 20.

In the optical module according to the embodiments of the present invention, plural optical elements such as a laser light source 20, MMI coupler 21, photodetectors 31 and 32 and the like are arranged in the holding body 12 of the package 11 as illustrated in FIGS. 1 and 2. Accordingly, if there are plural stray light reducing components are required to be arranged in the holding body 12 for reducing stray light corresponding to these optical elements, the package 11 has to be made larger and the optical module may be upsized inevitably.

However, in the embodiments of the present invention, the stray light reducing components, such as the stray light shield 60 as illustrated in FIGS. 1, 3 and 4 or the stray light shield 60R as illustrated in FIGS. 8 and 9, can be mounted not only in the holding body 12, but also to the cover-member 13 side in the package 11. In addition, the stray light reducing film can be formed on the inner surface of the cover member 13

In the embodiments of the present invention, the stray light reducing components can be provided with use of the cover member 13 in addition to the stray light reducing components arranged in the holding body 12. Or, in the embodiments of the present invention, it is possible to arrange additional stray light reducing components to the cover member 13 side instead of decreasing in number of the stray light reducing components arranged in the holding body 12.

If the stray light reducing component is thus arranged to the cover member 13 side, such arrangement does not obstruct arrangement of the plural optical elements in the holding body 12, and it is possible to arrange the stray light reducing component to the cover member 13 side easily corresponding to the plural optical elements in the holding body 12.

Here, the present invention is not limited to the above-mentioned embodiments and may be embodied in various forms. For example, the laser light source is not limited to the above-mentioned distributed feedback laser, but may be any other type laser. Besides, the number of photodetectors is not limited to two but may be one, three or more.

The shape of the stray light shield 60 is not limited to that shown in FIGS. 1 and 2 and may be any other shape.

According to the present invention, it is possible to prevent stray light from the laser light source from diffracting into, for example, a photodetecting portion inside the package, thereby preventing deterioration of the photosensitivity of the optical module.

What is claimed is:

1. An optical module comprising:
    a laser light source that emits a laser light;
    a package that houses the laser light source; and
    a stray light reducing unit that reduces a stray light generated in the package, wherein
    the stray light reducing unit is a stray light shield for blocking the stray light in the package.

2. The optical module according to claim 1, further comprising:
    an optical branching unit that receives the laser light, passes a first part of the laser light, and branches off a second part of the laser light; and
    a photodetecting unit that receives the second part of the laser light branched off by the optical branching unit, wherein
    the package further houses the optical branching unit and the photodetecting unit.

3. The optical module according to claim 1, wherein the stray light shield is at least one of a light absorber and a light scatterer arranged at a back side of the laser light source to block a backward stray light from the laser light source.

4. The optical module according to claim 1, wherein
    the laser light source includes a plurality of laser light sources emitting laser lights of different wavelengths,
    the optical module further comprises an optical element that multiplexes the laser lights emitted from the laser light sources, and
    the package further houses the optical element.

5. The optical module according to claim 4, wherein the optical element is a multi-mode interference coupler.

6. The optical module according to claim 2, wherein the stray light reducing unit includes a first stray light shield arranged at a back side of the laser light source to block a backward stray light from the laser light source, and a second stray light shield covering the photodetecting unit.

7. The optical module according to claim 6, wherein the package includes
   a package body having an opening, and
   a cover member for covering the opening of the package body, and the stray light shield is attached to the cover member of the package.

8. The optical module according to claim 6, wherein the second stray light shield is provided with a light absorber or light scatterer on a surface thereof.

9. The optical module according to claim 2, wherein the photodetecting unit includes
   a first photodetector that detects an output of the second part of the laser light, and
   a second photodetector that detects a wavelength of the second part of the laser light.

10. The optical module according to claim 3, wherein the package includes
    a package body having an opening, and
    a cover member for covering the opening of the package body, and the stray light shield is attached to the cover member of the package.

11. An optical module package comprising:
    a laser light source that emits a laser light;
    an optical branching unit that receives the laser light, passes a first part of the laser light, and branches off a second part of the laser light;
    a photodetecting unit that receives the second part of the laser light branched off by the optical branching unit;
    a first stray light shield arranged at a back side of the laser light source to block backward stray light from the laser light source from being reflected inside the package; and
    a second stray light shield covering the photodetecting unit to block stray light from entering the photodetecting unit,
    wherein the first and second stray light shields have a light reducing film or a light scattering structure on the surface thereof.

* * * * *